(12) United States Patent
Dakhil

(10) Patent No.: US 12,043,396 B2
(45) Date of Patent: Jul. 23, 2024

(54) METHOD, SYSTEM, AND APPARATUS FOR AN ALL-ELECTRIC AIRCRAFT

(71) Applicant: Farouk Dakhil, Rome (IT)

(72) Inventor: Farouk Dakhil, Rome (IT)

(*) Notice: Subject to any disclaimer, the term of this patent is extended or adjusted under 35 U.S.C. 154(b) by 322 days.

(21) Appl. No.: 17/412,626

(22) Filed: Aug. 26, 2021

(65) Prior Publication Data

US 2022/0063822 A1 Mar. 3, 2022

Related U.S. Application Data

(60) Provisional application No. 63/070,458, filed on Aug. 26, 2020.

(51) Int. Cl.
| | |
|---|---|
| *B64D 27/24* | (2024.01) |
| *B60L 8/00* | (2006.01) |
| *B64C 5/08* | (2006.01) |
| *B64C 9/00* | (2006.01) |
| *B64D 27/20* | (2006.01) |
| *H01L 31/054* | (2014.01) |
| *H02S 99/00* | (2014.01) |
| *B64D 27/02* | (2006.01) |
| *B64D 27/353* | (2024.01) |

(52) U.S. Cl.
CPC ............ *B64D 27/24* (2013.01); *B60L 8/003* (2013.01); *B64C 5/08* (2013.01); *B64C 9/00* (2013.01); *B64D 27/20* (2013.01); *H01L 31/0543* (2014.12); *H02S 99/00* (2013.01); *B64D 27/026* (2024.01); *B64D 27/353* (2024.01)

(58) Field of Classification Search
CPC .. B64D 27/24; B64D 27/40; B64D 2027/026; B64D 2211/00; B64D 27/353; B64D 27/34; B64D 31/18; B64D 27/33; B64D 35/022
See application file for complete search history.

(56) References Cited

U.S. PATENT DOCUMENTS

| | | | | |
|---|---|---|---|---|
| 9,493,235 | B2* | 11/2016 | Zhou | G05D 1/048 |
| 10,507,934 | B1* | 12/2019 | Dyson, Jr. | B64D 41/00 |
| 2013/0220399 | A1* | 8/2013 | Gruhlke | H01L 31/0547 |
| | | | | 136/246 |
| 2014/0103158 | A1* | 4/2014 | Berry | B64C 29/0025 |
| | | | | 244/12.1 |

(Continued)

FOREIGN PATENT DOCUMENTS

ES 1196335 U * 11/2017

OTHER PUBLICATIONS

Yang et al., "Design and static testing of wing structure of a composite four-seater electric aircraft", Sci Eng Compos Mater, 2020, pp. 258-263; doi.org/10.1515/secm-2020-0023; 6 pages.

(Continued)

*Primary Examiner* — Philip J Bonzell
(74) *Attorney, Agent, or Firm* — Maier & Maier, PLLC

(57) ABSTRACT

Methods, systems, and apparatuses for an electric aircraft may be shown and described. The electric aircraft may include a body; a first wing and a second wing, each of the first wing and the second wing having a plurality of stabilizers and a plurality of flaps; a cockpit; and at least one of a dielectric elastomer power generator, a wind turbine, an electric jet turbine, and a rotational electromagnetic power generator mounted on a central plane surface on the body.

7 Claims, 12 Drawing Sheets

(56) References Cited

U.S. PATENT DOCUMENTS

| | | | |
|---|---|---|---|
| 2016/0009402 A1* | 1/2016 | Hunter | B64U 10/20 244/53 R |
| 2016/0114887 A1* | 4/2016 | Zhou | H04N 7/181 348/148 |
| 2017/0137138 A9* | 5/2017 | Hunter | B64D 27/24 |
| 2022/0041299 A1* | 2/2022 | Wankewycz | B64D 27/24 |

OTHER PUBLICATIONS

Ninian and Dakka, "Design, Development and Testing of Shape Shifting Wing Model", MDPI, Aerospace, 2017; doi:10.3390/aerospace4040052; 24 pages.

Min et al., "Aircraft morphing wing concepts with radical geometry change", The IES Journal Part A: Civil & Structural Engineering, 2010, pp. 188-195;doi.org/10.1080/19373261003607972; 9 pages.

Budarapu et al., "Design concepts of an aircraft wing: composite and morphing airfoil with auxetic structures", Front. Struct. Civ. Eng., 2016; DOI 10.1007/s11709-016-0352-z; 15 pages.

Hu et al., "Fully Parametric Optimization Designs of Wing Components", Hindawi International Journal of Aerospace Engineering, 2020; doi.org/10.1155/2020/8841623; 11 pages.

\* cited by examiner

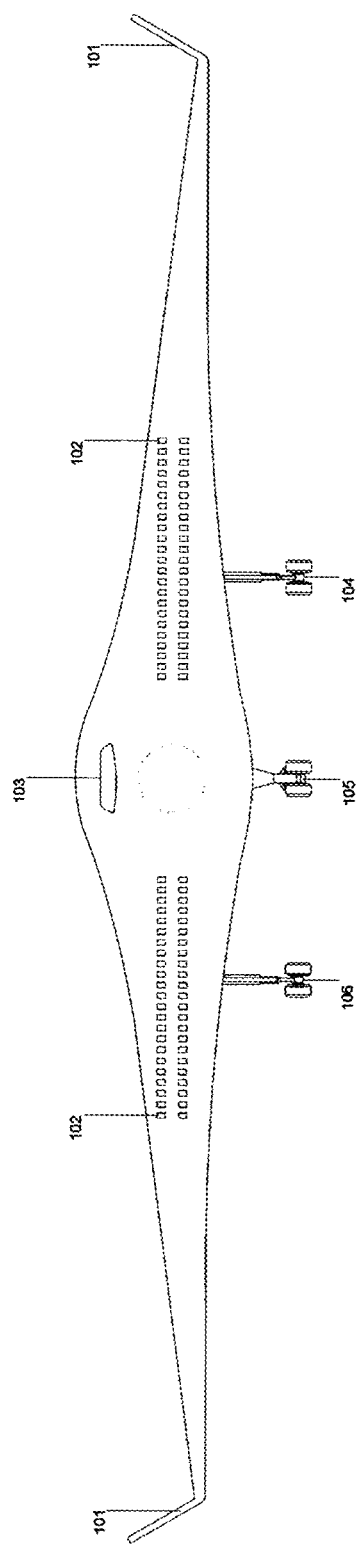

METHOD, SYSTEM, AND APPARATUS FOR AN ALL-ELECTRIC AIRCRAFT

CROSS-REFERENCE TO RELATED APPLICATIONS

The present application claims benefit and priority to U.S. Provisional Patent Application No. 63/070,458 filed on Aug. 26, 2020, which is hereby incorporated by reference into the present disclosure.

BACKGROUND

There are more than 9 million deaths each year from air pollution caused mainly by manmade emissions. Air-traffic and aeroplanes carry a great part of this pollution in emissions and micro-particles, in addition to noise. Emission-free planes could contribute in reducing said pollutions. Kerosene-based fuel is a highly polluting fuel used for aeroplanes via its soot particles that also create a kind of a condensate that accelerates global warming further. Fine particles (fine particulate matter) in diesel exhaust (e.g., soot, sometimes visible as opaque dark-colored smoke) has traditionally been of greater concern, as it presents different health hazards like even cancer. Soot particles also create a kind of a condensate that accelerates global warming further (see https://www.e-education.psu.edu/egee102/node/1951)

There have been many trials and solutions to develop an electric powered aeroplane by many like a solar photovoltaic powered plane. However, such solar planes powered by photovoltaic panels have a lot of difficulties, because they lack the sufficient power to resist real winds at high altitude where winds speed are 8 to 40 times that on the surface of the earth, depending on altitude and weather conditions. Commercial solar photo-voltaic panels have an energy density varying from 5-7 watts per square meter in Europe and 20-23 watt/m $2$ in desert areas, while at high altitude and wings of an aeroplane are usually horizontal to sun rays, the energy harnessed is rather very low. The engineering task for such an endeavor is extremely difficult.

Because an aeroplane needs a huge amount of energy/power for its propulsion and, certainly, solar photovoltaic is not sufficient for a useful aeroplane, therefore a combination of alternative energy sources ae required to be applied for a total replacement of fossil fuel.

SUMMARY

In the embodiments, three different technologies may be used: dielectric elastomer generator (DEG), solar micro-lenses and high altitude wind turbines (U.S. Pat. Nos. 9,419,545, 9,350,290 and 9,732,967, respectively, and incorporated by reference). In some embodiments, the other most powerful magnetic generator (U.S. Pat. No. 9,537,368, incorporated by reference) could also be inserted into the assemble of power generation units on board of this new generation green zero emission aircraft or airplane. The latter is a special wind turbine that will generate electric power in both directions if winds blow from the front or back the turbine will generate electric power just the same. Such combination would generate enough energy to propel said plane with much higher speeds and comfortable passage relatively. Indeed, internal combustion aeroplane turbines in this matter are much higher and need not be compared. Indeed, a solar photovoltaic powered plane would need the solar rays best perpendicular to its wings area while in reality the wings need to be horizontal and not perpendicular and facing the sun and towards south. In the embodiments, the solar micro-lenses are more in a position to collect enough sun light and at higher rate and intensity as the lenses curvature gives and additional advantage. Additionally, as the plane speeds up the wind turbines would rotate more and thus produce even more energy which helps the overall power supply for the plane. Similarly, as the plane moves forward and speed increases the "wing-tale" of the dielectric elastomer generator (DEG) would oscillate more rapidly and frequently whereby producing ever more power for the plane; effectively the mere oscillation/flattering of the wing-tale would help in propelling the plane.

The magnetic generator (MG) power generator plant could use a battery to guarantee its continuous oscillation in order to overcome friction and air resistance. However, while on the plane there are two other external power supplies, i.e., micro-lenses solar energy and wind turbines, DEG is more than sufficient to supply necessary power for the continuous running of the MG power generator providing enough energy for the plane to take off and fly around the globe if needed. In this case, the rotational embodiment of the MG is possibly more adequate for a plane power supply as less parts are needed and less moving parts as well. Further, a version of MG 2.0 may have all pulleys and magnetic shielding wall and, even the need for a possible super conducting material would not be needed indeed.

The lightweight dielectric elastomer can stretch and contract when stimulated by low voltages so that the tendon like material used for both the DEG cushions and flanges during landing of the plane are both lightweight and need only low voltage current to contract and thus rise to cause air resistance to the plane to help braking the areoplane until it stops (see Adv. Mater. http://doi.org/f3s534 (2016), incorporated herein by reference)

A 24-30 seat all electric aircraft prototype with two high efficiency bi-directional wind turbines and one all electric jet propulsion turbine (low torque high efficiency—similar to Oswald electric motors in Germany) and two electric motors at the aircraft wheels may be provided in the embodiments. Electric propulsion turbines are up to 80% efficient than fossil fuel jet propulsion turbines of a similar power have an efficiency of only 20-30%. Indeed, such an electric jet propulsion turbine would have much less weight as well and much less whole load of internal combustion parts and components, and the rest of IC engines. Additionally, a body of the jet turbine may be made of light weight carbon reinforced material that is stronger than aluminum or steel, all of which will also need much less maintenance and overhauling by mechanics as the aircraft is much less complicated and easy to maintain. Also, such an electric aircraft would be almost noiseless and an emission free sky vehicle.

According to conservative calculation to produce, on board of the aircraft, about one to one and a half megawatts of power for the jet and electric motors to propel and supply enough power for all equipment of the aircraft supplied by all three technologies here above mentioned are possible embodiments.

By placing the jet turbine at the tail of airplane and the tow wind turbines on top of plane will reduce the drag by increasing the suck of air and accelerate the flow of air (see study by Edward Greizer et.al. at MIT, AIAA JOURNAL Vol. 55, No. 11, November 2017. https://doi.org/10.2514/11055755)

A super-capacitor may be integrated under the solar micro-lenses, which could also be 3D printed and laminated together with the aircraft wings. Such super-capacitors could store a limited amount of energy for short bursts of high-power use, such as during takeoff, landing and braking.

Additionally, there may be a flywheel in which braking energy and all other unused power is stored and can be used as needed, for example, during takeoff and landing. The flywheel can be made of light weight carbon reinforced lignin material that is lighter than aluminum and steel while, 200 times stronger than steel and aluminum. The flywheel may also be manufactured by a 3D printer, i.e., an additive manufacturing system which will save waste material and costs.

At all times, and, in particular, when parked or not running, the aircraft would continuously be harnessing energy from wind, electro-magnetism, and sun light by its energy generating devices: the wind turbines WT, the dielectric elastomer generator DEG, the solar-micro-lenses SML and the magnetic generator MG storing all this energy in the flywheel and super-capacitors on board of the plane.

Further embodiments may include the following. Energy storage on board of aircraft: there are two flywheels, one is place in front and one in the rear, bottom of the aircraft in order to store all excess energy during parking i.e., when aircraft is in standstill position and during braking from all of the power generating devices on the aircraft. This stored energy is used for acceleration of the aircraft during takeoff and maintaining temperature of electronics and inside cabin at room temperature.

Wind turbines on board of aircraft: there are at least three blades inside the wind turbine on top of aircraft as shown in FIG. 4, which may have also five blades as shown in FIG. 4A in their design, for maximum forward propulsion reasons, as this is known for those skilled in the art of propellers' design in ship building. The difference between propulsion of the propellers in seawater or in the air is only a matter of the difference in the viscosity of the two mediums, while air is only less dense than seawater. However, the energy density is also less but this shall be compensated by the other power generating devices on board of the aircraft.

Helium and air tanks on board for take off and landing: further, there are two tanks under the belly of the aircraft underneath the luggage compartment space: one containing helium and the other just air. Additionally, there is also a gyroscope placed in the middle as shown in a frontal cross section image of FIG. 2A of the plane. The first tank will be filled with helium gas and the second contains atmospheric air. The helium gas will give the electric aircraft, also known as an eAircraft, the uplift needed to start vertically upwards from the ground, as helium is lighter than air but only when the second air-tank is also empty, i.e., when all the air inside second tank has been expelled or pumped out. Thus, the whole acceleration power needed for take off and/or landing will be not be needed. The gyroscope will have the function to keep the eAircraft always upright and well balanced at all times. This special feature would allow the eAircraft to take off or land without consuming much energy for neither accelerating or braking during take-off and landing.

BRIEF DESCRIPTION OF THE FIGURES

Advantages of embodiments of the present invention will be apparent from the following detailed description of the exemplary embodiments. The following detailed description should be considered in conjunction with the accompanying figures in which:

Exemplary

Exemplary

Exemplary

Exemplary FIG. 2 shows the first electric aircraft from a front perspective

Exemplary

Exemplary

Exemplary

Exemplary

Exemplary

Exemplary

Exemplary

Exemplary

DETAILED DESCRIPTION OF THE EMBODIMENTS

Aspects of the invention are disclosed in the following description and related drawings directed to specific embodiments of the invention. Alternate embodiments may be devised without departing from the spirit or the scope of the invention. Additionally, well known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention", "embodiments" or "invention" do not require that all embodiments of the invention include the discussed feature, advantage or mode of operation.

Figure 1:
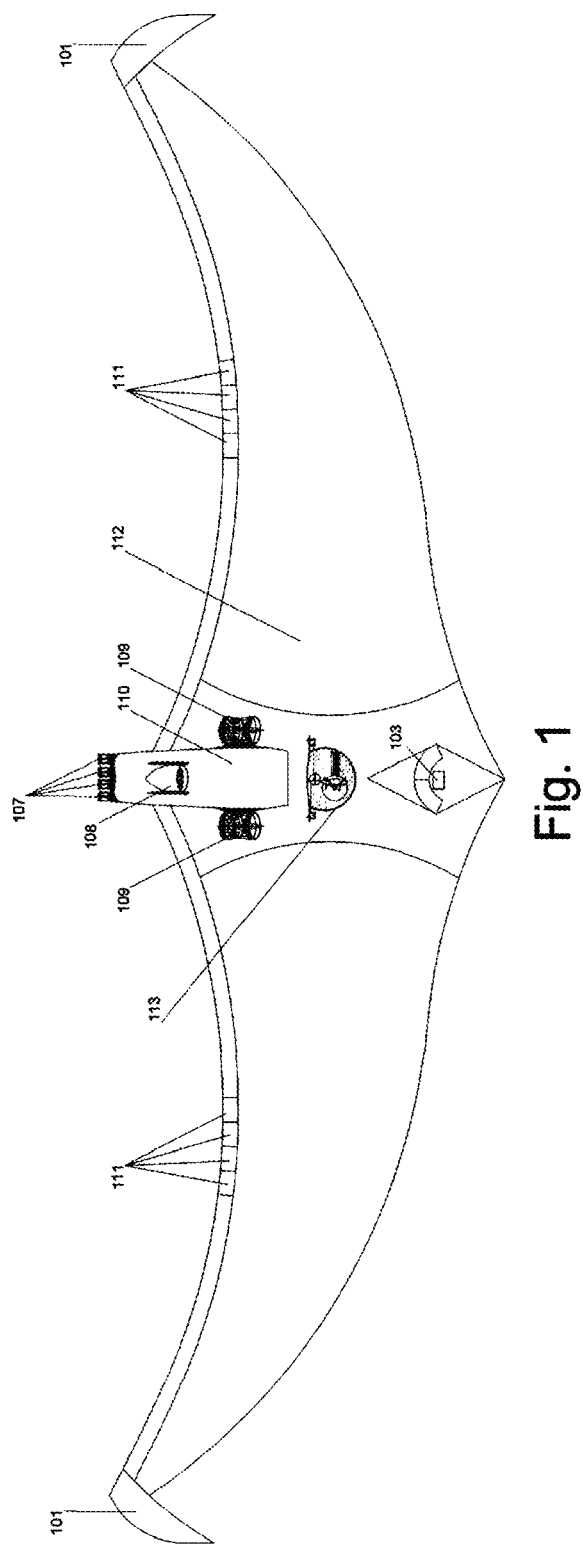
FIG. 1 shows a detailed arrangement of a first embodiment of the electric aircraft from a top view perspective.

Now referring to exemplary FIG. 1 showing an eAircraft with all its parts from a top view. The aircraft may have two stabilizers on each wing 101 and several flaps 111 on the rear central part of the wings. There may be 4 dielectric elastomer power generators (DEGs) 107 above, two wind turbines 109, and an electric jet turbine 108. There may also be an additional source of power generation on board of the aircraft 113, which may be a rotational electromagnetic power generator. All power generating devices are on the top of the central plane surface 110 with a possible exception of the electromagnetic power generator 113 that can be placed inside the body of the aircraft together with a central electronic unit underneath the cockpit 103 that controls the whole functioning of the power generation devices on the plane in a most efficient and proper manner. The wings of the aircraft may or may be just plane surface or planted with solar microlenses as shown below in FIG. 1A alternative solution.

Figure 1A:
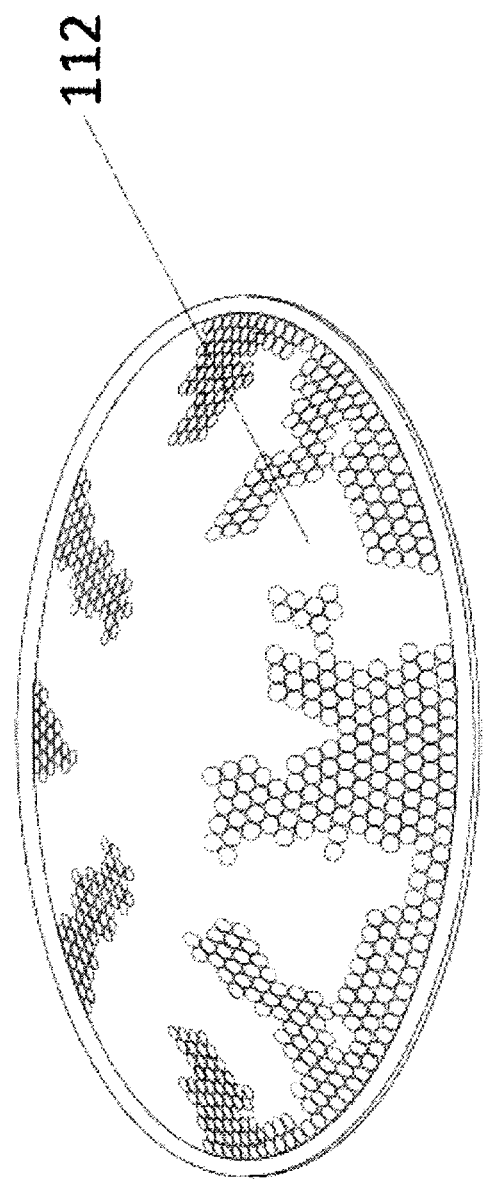
FIG. 1A shows a concentration lens made of a an arrangement of micro-lenses focalized upon a solar cell.

Now referring to exemplary FIG. 1A, this figure shows this high concentration solar cells embodiment 30 which may be implanted on aircraft's wings in FIG. 1A below.

The structure making the surface of the wings 112 of the eAircraft can be concentration lenses 31 made of multiple micro lenses 32 and a high efficiency heat resistant solar cell 33.

The lens can be made of acrylic or bio-degradable plant lignin with possibly graphene oxide reinforced or any other favorable material able to resist high temperatures. The magnifying thickness of each lens 32 could be in nanometer or practically at the center of lens may have a thickness of 0.3175 cm and the thin film micro lenses has a width of 0.040 mm. The idea of the micro-lenses is inspired from nature many insects eyes are made of pluri-lenses 32 in which light coming from all directions (almost 200°) is focalized on a single spot and here we focalize onto a solar cell 33 which may be made of gallium arsenide 33 (as for example a solar cell with highest efficiency developed by John A. Rogers in his paper published in Nature DOI: 10.1038/NMAT3946). Sunlight is thus intensified more than 200 times due to this magnifying effect as described in my solar house U.S. Pat. No. 9,350,290

Figure 1B:
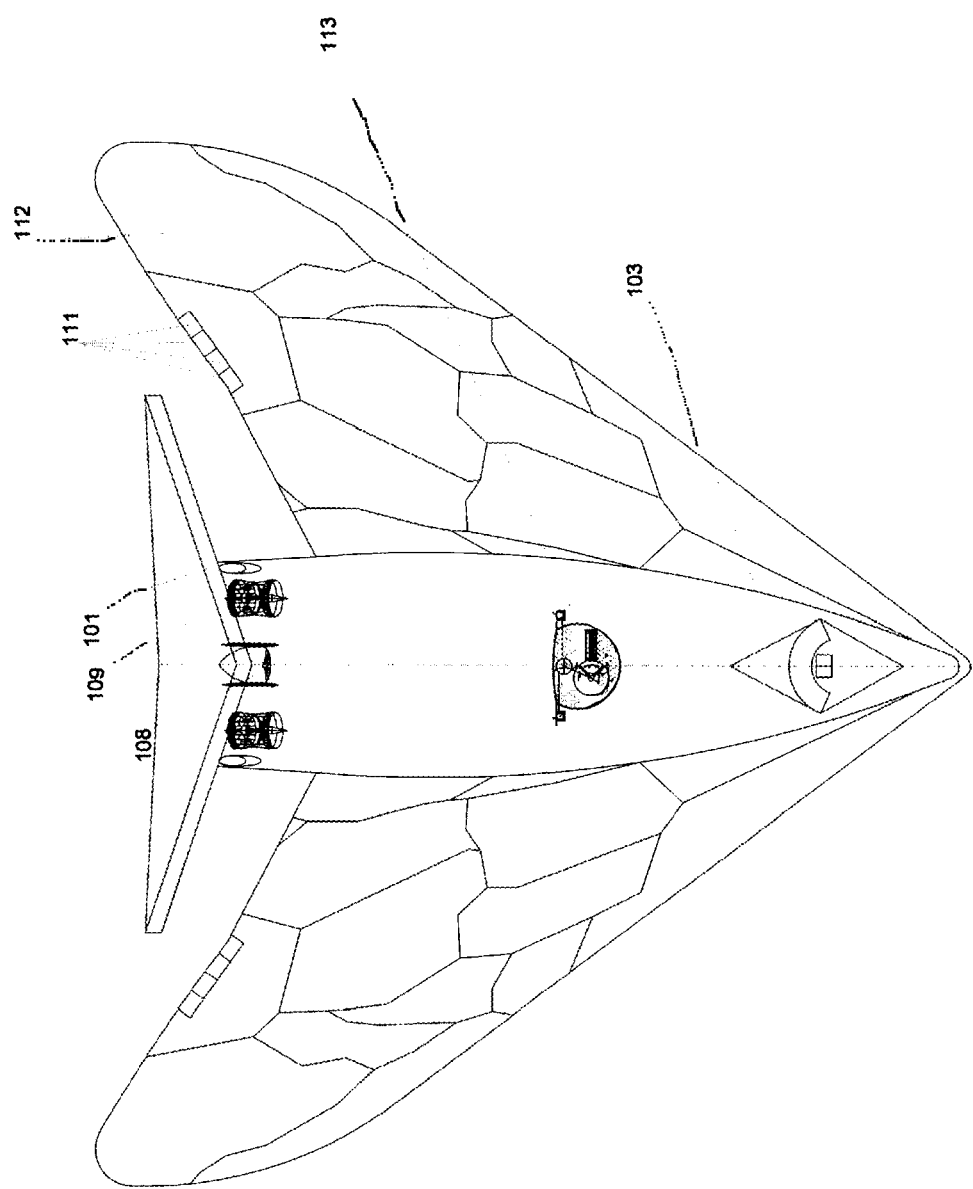
FIG. 1B shows a specific detailed embodiment of the electric aircraft with alternative stabilizer arrangement and large wings.

Now referring to exemplary FIG. 1B, in which there is the same arrangement as in FIG. 1 with the wings of the aircraft covered with said solar microlenses 30. However, in this embodiment, the stabilizer of the aircraft may have a different stabilizer placed on the rear of the aircraft as been developed by the MIT team for the NASA as described above also.

Figure 2A:
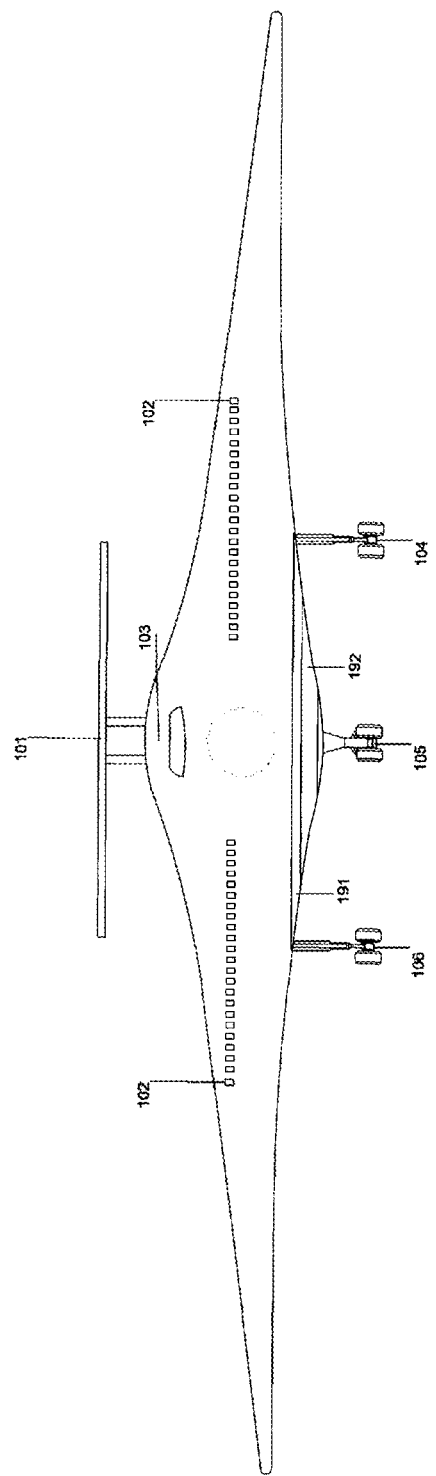
FIG. 2A shows the second embodiment frontal cross section of the aircraft with the alternative stabilizer from a front view perspective with the two tanks for helium gas and atmospheric air.

Now referring to exemplary FIG. 2, the aircraft is shown in a front view as described in FIG. 1 with its windows 102 and seats placed inside the wings for efficiency reasons. The aircraft may have three sets of wheels for its stability a pair at the front 105 and two sets at the back 104 and 106 respectively Now referring to exemplary FIG. 2A, this figure shows another possible solution of the aircraft as described in FIG. 1.1 with the stabilizers may be placed at the rear of the aircraft. There are two tanks under the belly of the aircraft underneath the luggage compartment space: one containing helium 191 and the other 192 atmospheric air. Additionally, there is also a gyroscope placed in the middle, as herein shown, of the plane. The first tank will be filled with helium gas and the second contains atmospheric air. However, the space compartment containing the helium gas may extend to also fill the space under the whole volume area of the wings (where kerosene or fuel may be stored in a traditional airplane) and can thus lift larger and heavier aircraft weight, along with carrying more cargo and passengers. The helium gas will give the eAircraft the uplift needed to start vertically upwards from the ground, as helium is lighter than air but only when the second air-tank is also empty i.e., when all the air inside second tank has been expelled or pumped out. Thus, the whole of the acceleration power needed for take of and/or landing may be not be needed The gyroscope will have the function to keep the eAircraft always upright and well balanced, at all times. This special feature would allow the eAircraft to take off or land without consuming much energy for either accelerating or braking during take-off and landing.

Figure 3:
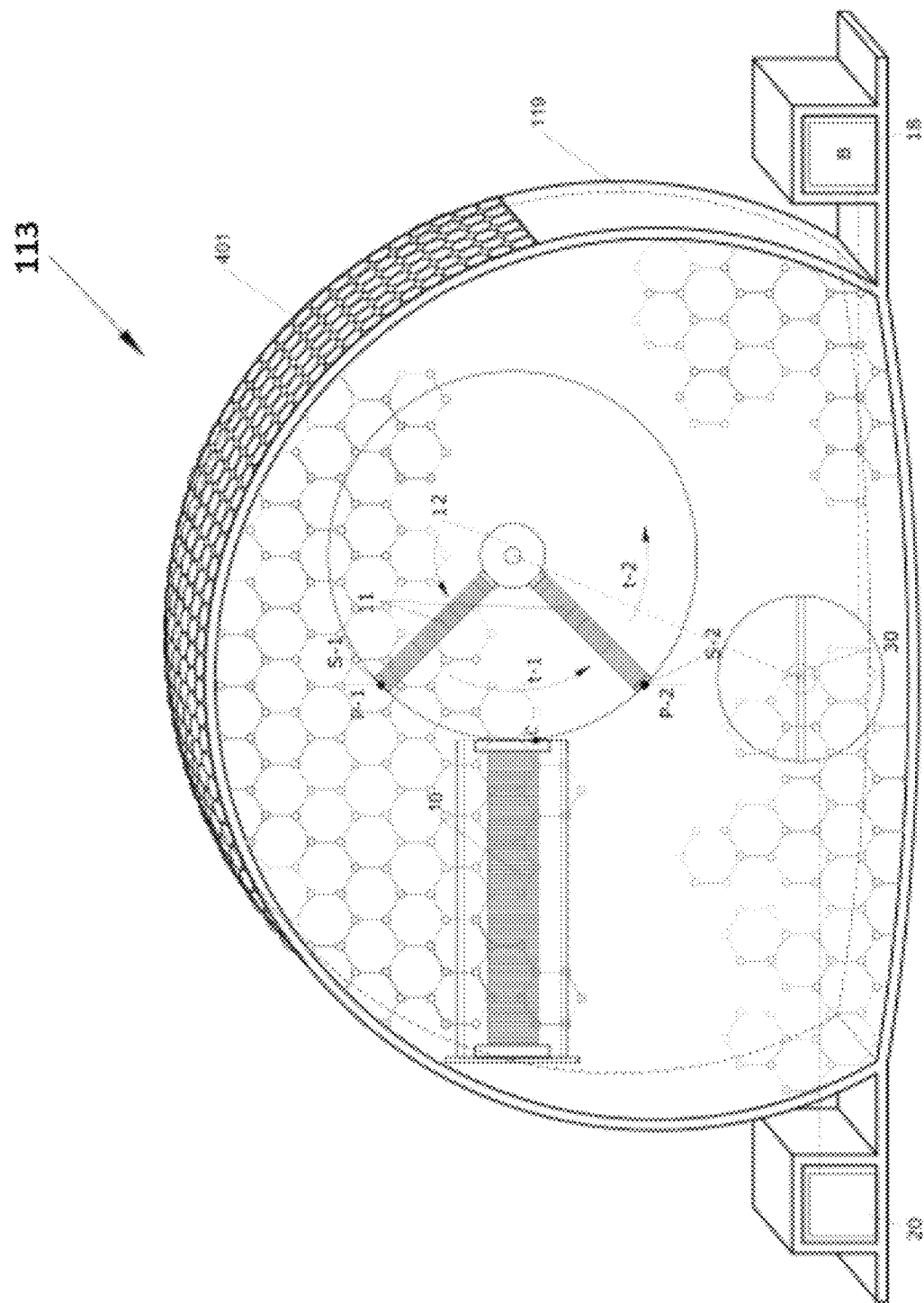
FIG. 3 shows the first detailed power generation device on board of the electric aircraft.

Referring now to FIG. 3, a magnetic generator mechanism 113 may include at least one magnetic cylinder directed towards a magnetic blade 11 placed at the center of this mechanism-device which functions as a free rotating blade. Blade 11 may be made of magnetic cylinder material through which current at a precise moment and only for a very brief time period would be flown to magnetic blade 11 and simultaneously magnetic cylinder 10 similarly. Thus, magnetic cylinder 10 and magnetic blade 11 may be positioned with equal poles directed toward one another in order to produce a repulsion force between said tow once current from the battery 18 flows through coils in both blade and magnetic cylinder 10.

Magnetic cylinder 10 may be placed in this embodiment in such a way that its magnetic equal (+ve or −ye pole) force is substantially directed at the other magnetic blade 11. There may be a point in time in which the two magnetic cylinder 10 and 11 reach nearer to one another, referred to as the "point of incident" (PI). PI is the point in time when magnetic cylinder 10 and magnetic blade 11 come near enough to one another in order to repel one another and thus blade 11 may continue to rotate. Once blade 11 passes a critical point P, the magnetic force of magnetic cylinder 10 may drive blade 11 by repulsion in an anti-clockwise direction.

Blade 11 may be welded to a metal shaft 12 which may rotate in a circular motion as the blades set in motion by the force of the magnetic field exerted by the magnetic cylinder 10 upon blade 11. Around the central shaft there may be a stator (generative coil housing) which may produce electricity as shaft 12 rotates inside this stator. The shaft 12 is welded to said blades substantially at the center of this electromagnetic assembly or embodiment.

The magnetic field of magnetic cylinder 10 would only be magnetic at the moment blade 11 has just reached position C which is slightly downward to make sure that the current would flows only when blade 11 has passed critical position for the actual repulsion forces to take place also the contact point at which time only current would flow from battery 18 in order to magnetize both cylinder 10 and blade 11 to push it further into an ever faster accelerated angular motion There may be sensors, S1 and S2, each placed at critical positions, P1 and P2. The sensors would signal for each magnetic cylinder the critical position of blade 11. Once blade 11 has reached P1 magnetic cylinder 10. In case of a vehicle using second embodiment 10 will substantially all braking forces, if any here, and the work (energy) done by magnetic cylinder 10 and 11 in this system may be transmitted to this flywheel for storage and eventually rebooting the system from stored electrical power inside the flywheel or from an external battery 703. Thus, the blades 11 may then receive only the repulsion or "push-force" from magnetic cylinder 10 to continue its rotations in one direction at all times. The use of a flywheel as a storage mechanism and its application is a conventional state-of-the-art technology. Additionally, the rebooting of the system may be also powered by the solar electric energy produced on the roof top 407 of vehicle and/or building of a power plant in order to keep the battery 18 charged at all times. Thus, the system is indeed an open energy system, from a thermodynamic point of view.

The whole system may be controlled and wired by an overall electronic central unit 704 which also controls other components of this device.

Additionally, all other components around the magnetic cylinders 10 and 11 may be constructed of a material which is non-magnetic and not attracted by the magnetic cylinders at all times. Such a material may be aluminum or carbon alloys which are very hard and resistant also to corrosion. However, the whole magnetic embodiment may be placed inside a CNT case 702 in order to shields the system from the environment for all reasons of interference with any other metallic objects herein or around the arrangement on top of which there may be additional micro lenses 701 for additional power generation using sun light in this case, when available.

The sensors may be programmed by software in such a way that the movement of magnetic cylinder 10 is coordinated and substantially synchronic to blade 11 to receive the maximum amount of magnetic repulsion or push to continue its angular revolution on its axis 12. Such sensitive software program systems are well known to those skilled in this art. After an initial repulsive "push," blade 11 may continue to move in its circular movement at ever higher velocities as controlled by hardware device 704.

The system may need to be placed in a vacuum to reduce air resistance on the moving blade 11. Additionally, a recycling coolant or water radiator (not shown) may ensure low temperatures and reduce frictional heat produced by the blade circular movement and may assist in obtaining higher speeds and efficiency, while the frictional heat may be used to heat the aircraft cabin inside the plane.

The rotary-shaft 12 may be embedded in a shielded magnetic field or connected to generate electricity for the electric jet turbine.

Figure 4:
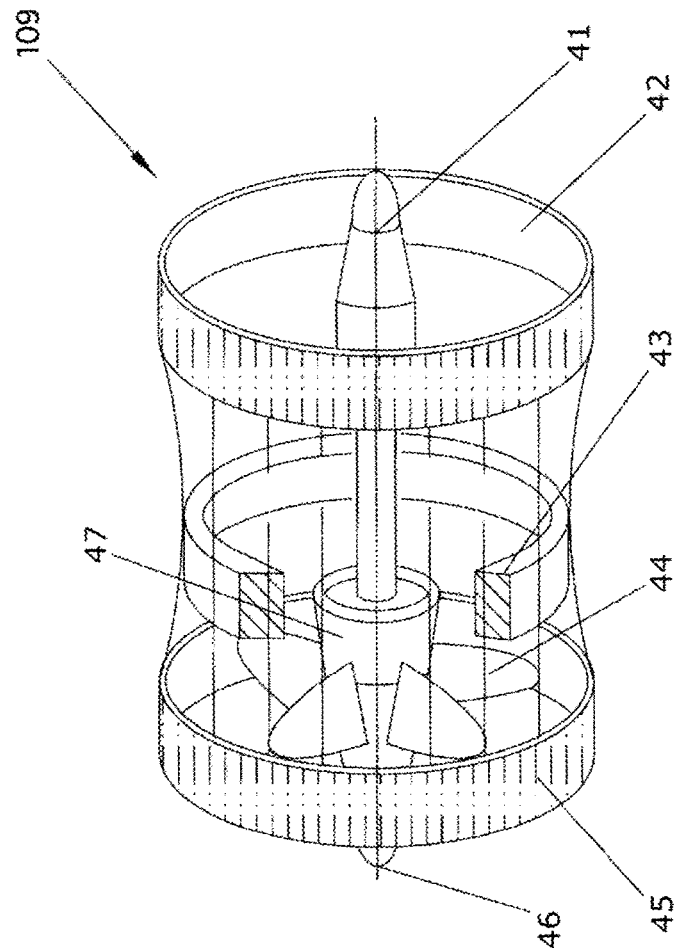
FIG. 4 shows the second power generation device in detail.

Now referring to exemplary FIG. 4, a two-way power generating wind turbine 109 may be used to harness the wind energy as the aircraft moves forward and the air thrust is extremely high on the blades 44. The two-way turbine 109 may include an outer case 45, turbine blades 44, and a central stator magnet 43. Either end of turbine 40 may have an aerodynamic structure form 41, 46 to allow smooth passage of wind through its blades 44 in both directions in such a way that blades 44 may rotate due to wind from either direction and thus may cause shaft 47, onto which blades 44 may be fixed, to rotate inside a stator structure 47. The turbine's blades 44 may be constructed in such a way that they may rotate and generate electricity regardless of the flow direction of the wind as the aerodynamic structure form 41, 46 depicted in FIG. 4 may alternatively be hollow to allow the smooth flow of air through the turbine 40, to reduce the weight of the turbine 40, or for other reasons. This may increase the overall efficiency of the turbines 40. Further, the turbine blades 44 may be constructed from lightweight material, for example carbon-epoxy-composite (CFRP). Turbine blades 44 may themselves be hollow or partially hollow, for example employing a honeycomb-like internal support structure constructed through the use of 3D printing or may be constructed from a solid material.

Figure 4A:
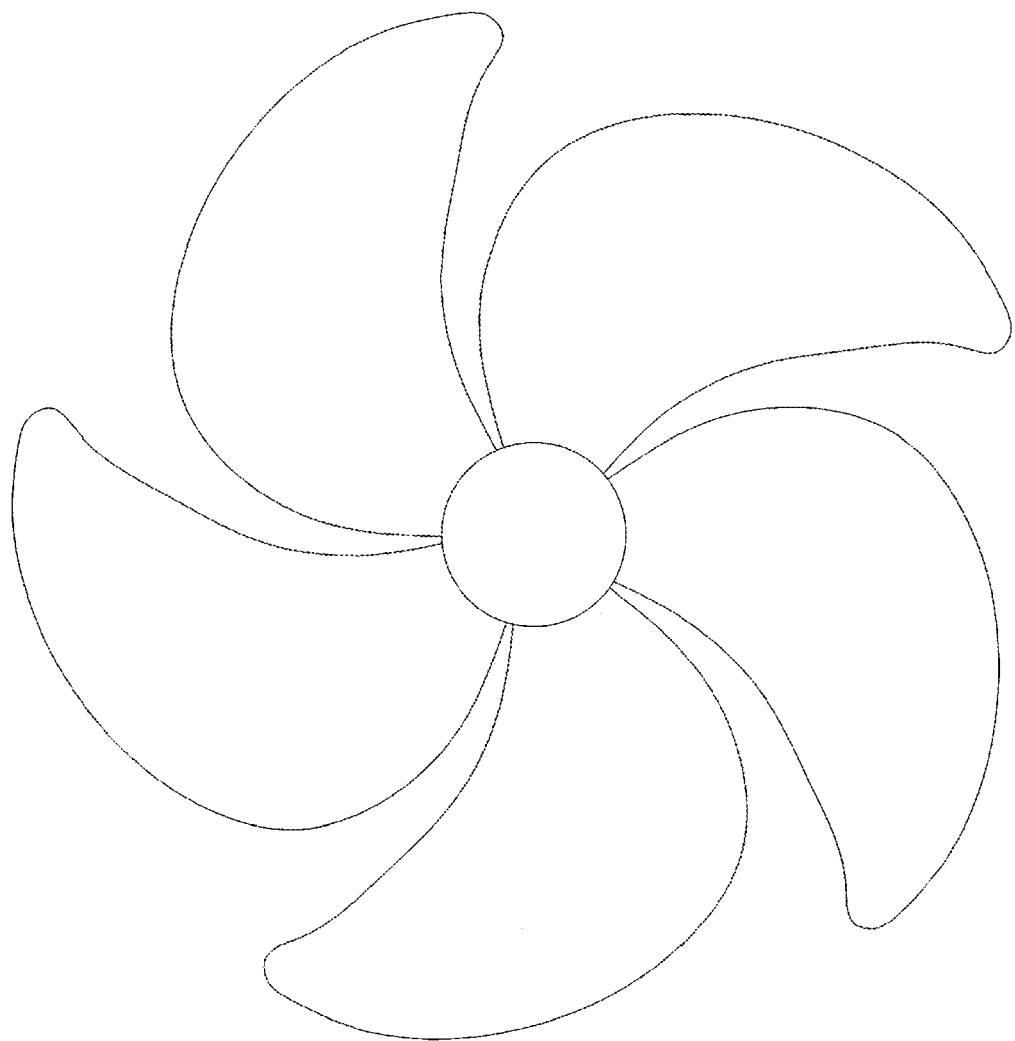
FIG. 4A shows the new forward propelling blades design.

Now referring to exemplary FIG. 4A, this figure shows a design of the five blade propeller for a forward moving propulsion to replace the bidirectional propeller.

Figure 5:
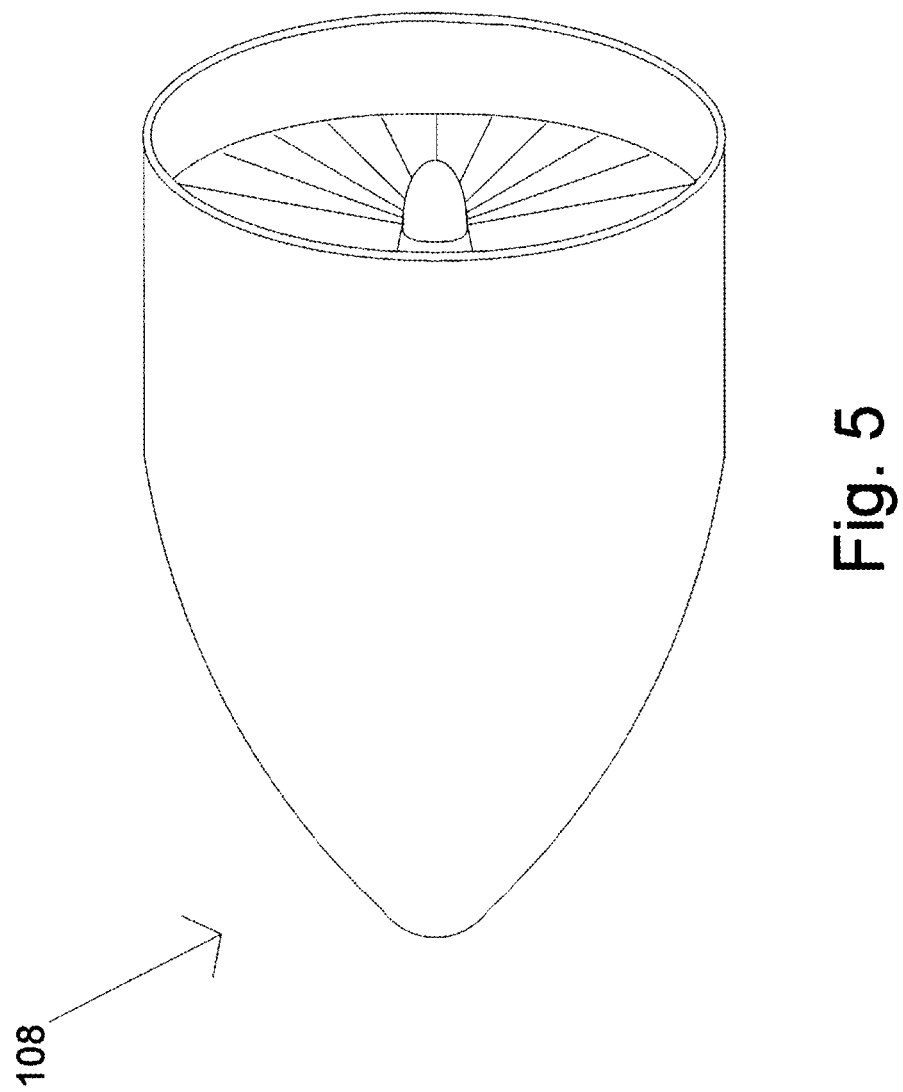
FIG. 5 shows the electric jet turbine for the propulsion of the aircraft.

Now referring to exemplary FIG. 5, this figure shows a conventional electric jet turbine 108 with at least one thousand HP or 745699.872 watts (1 hp(I)=745.699872 W) so that the assembly of a power generator on board of this aircraft can easily generate. It is understood that a 300 HP jet engine would lift a small aircraft, however the weight of an electric jet turbine has almost one half the weight of a conventional internal combustion engine (see RR new jet turbine that weighs one tone and has a 300 HP only: https://www.rolls-royce.com/products-and-services/civil-aerospace/helicopters/rr300.aspx#section-technology)

Figure 6:
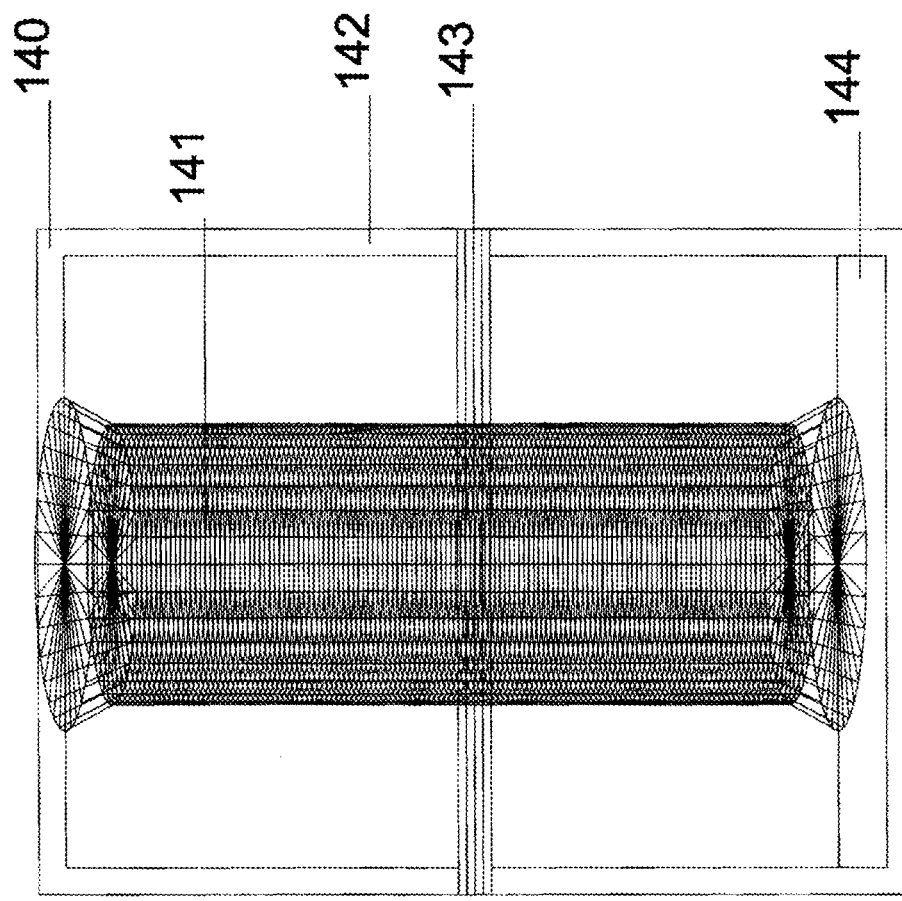
FIG. 6 shows a unique wing flap mechanism.
Figure 6:
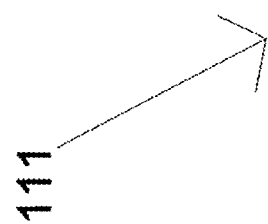

Now referring to exemplary FIG. 6, this figure shows the flap of the aircraft wing 111 that has the same "W" 115 shaped "hinge" substitute following the concept of "all in one piece, no separate parts" in order to minimize wear tears and maintenance services at the same time this is made of the same material of DE generator DEG as now the material may be used as an actuator and not in the generator mode, i.e, the actuator would expand and move the flap upwards by applying this time electric current and thus the flap would rise up and do the same function as with an electric piston as it is used in conventional aircraft. Further, FIG. 6 shows a tendon-like piston where 140 is a supporting disk on the wing of the aircraft, 141 is a moving part of the tendon-like structure, 142 is the framing structure the moving part 141, 143 is a hinge-like element for moving a flap up and down and other support base 144 can be used with respect to the moving element 141/piston that enables the aircraft to stop during braking (in a wide open position) and is close during take off and flight.

Figure 6A:
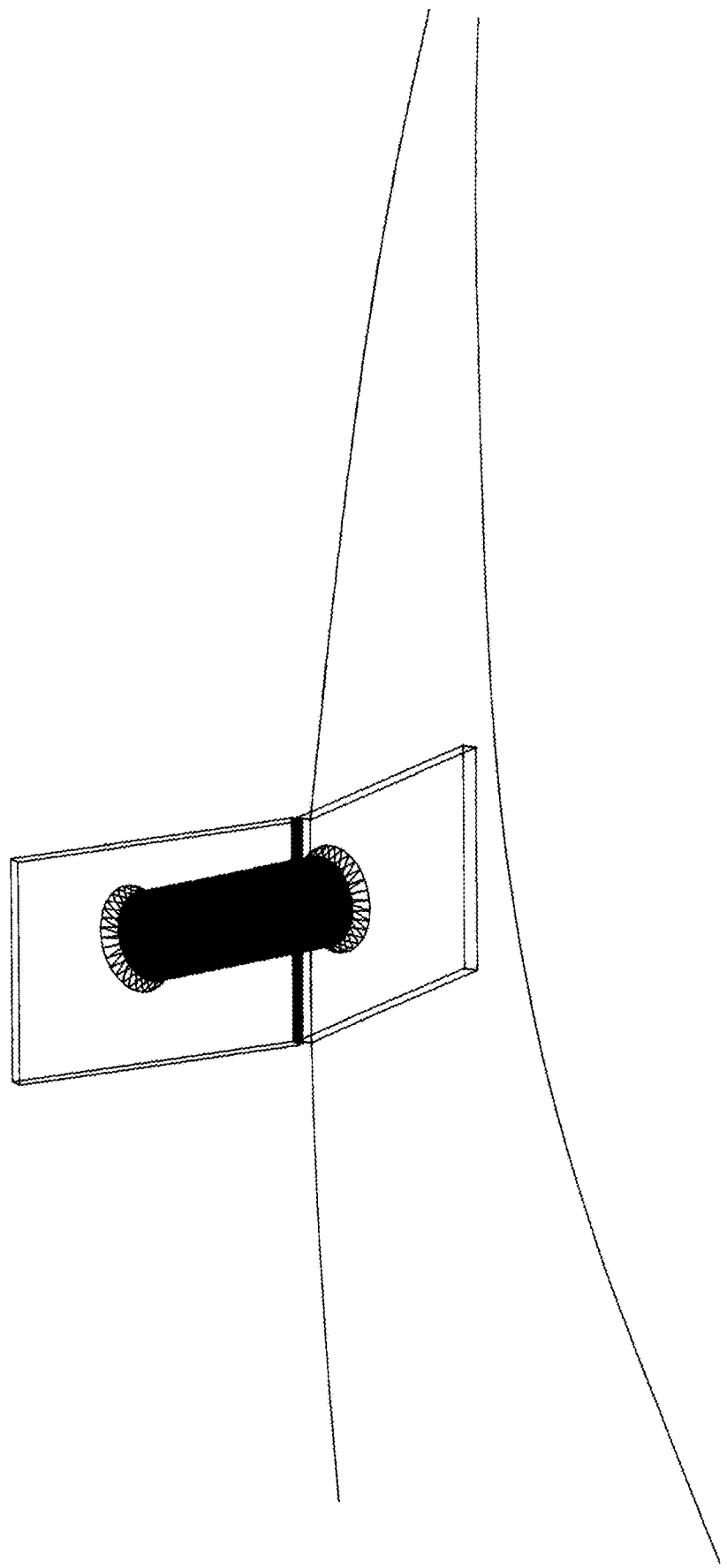
FIG. 6A shows the later unique wing flap integrated on plane wing.

Referring now to FIG. 6A, this figure shows the same one flap integrated in the actual wing of the aircraft plane of which there may be another two or three flaps with similar actuators connected to the electric power on the plane. There are two parts the wing flap the moving part 140 and the fixed part 144. The moving part 140 will expand and erect the flap as electrical current is supplied to the dielectric elastomer material 141 to an almost perpendicular or to a desired angle to the wing surface and stay off unless the current is cut off, as the dielectric elastomer material expands in the direction of the electric current and according to the strength of the current the angle of inclination of the flap 140 is determined. The moving flap 140 closes slowly as the current drops and the flap would gradually come back to its original position on the wing aligned with its surface. Now the hinge-like structure 143 (in the form of "W") allows the flap 140 to move up and down while the other support base 144 stays fixed and welded to the surface of the wing.

Figure 7:
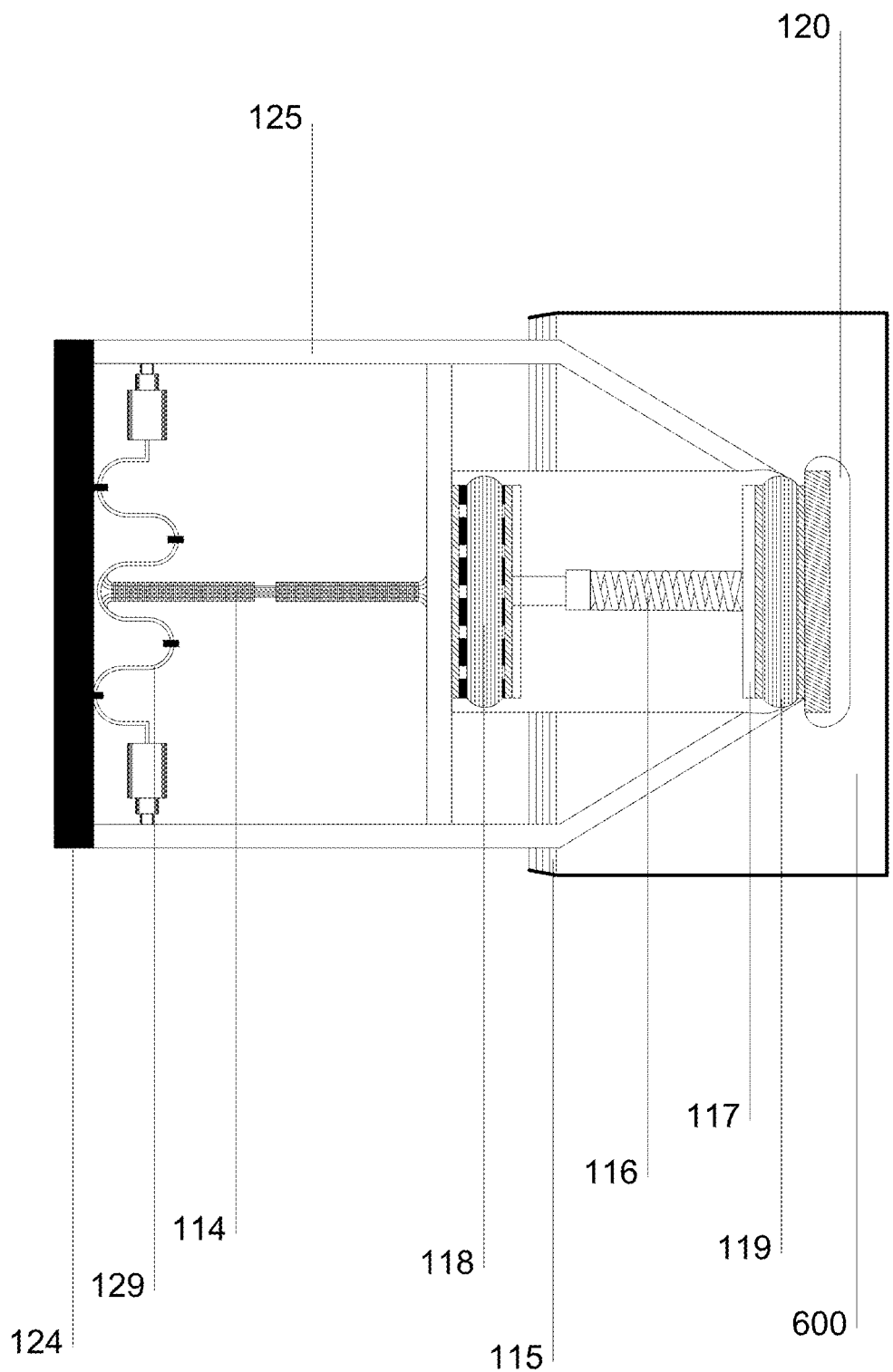
FIG. 7 shows the electromagnetic power generator with micro-lenses on top.

Now referring to FIG. 7, a flap 600 of the aircraft tail is provided, which may be in a horizontally flat position from the surface of the tail to guarantee the minimum impact of the thrusting force of the air during flight. Flap 600 may then vibrate or oscillate, generating additional power to the aircraft. At the center of the tail 600 there may be a depression-like structure 120 in which a multilayer dielectric elastomer cushions 118 and 119 are firmly and permanently glued (see for example a super sea mussels inspired glue). There is a strong carbon-reinforced plate 117 placed at the base of the cushion 118 to guarantee solid and stable compression on the elastic DE cushions 118 and 119. Further, part of the above piston plate 117 allows the piston 116 to move in an oscillation-type movement, absorbing wave forces and conducting it to the other DE cushion. There may be a "W" like form structure 115 allowing the tail 600 free movement with any separate parts like a fringe following the earlier concept of "all in one piece, no separate parts" principle. This structure is made of a carbon reinforce material just like the tail 600. There may be a separation disk made of carbon fibers reinforced material with a specific straight part 128 hand wrist tendon-like material at the upper end allowing the rod to move freely without any fringe as explained above in a hand wrist like (all in one piece) allowing the shaft with two electric dynamos 129 at each end free a rotational movement in order to generate additional electric power providing the necessary energy for the functioning of the aircraft as a whole. Finally, a fixed wall 124 may connect to the main structure of the aircraft. The whole power generation system of the flap 600 may be placed in a hermetically sealed and waterproof outer case 125. Additionally, and in furtherance to the above, flap 600 may include four separate flaps and the four separate flaps may oscillate at low amplitude, while also in phase and synchronous to each other, which may further contribute to power generation in the aircraft.

The whole system may be controlled and wired by an overall electronic central unit 704 which also controls other components of this device.

Further, it may be appreciated that various technical specification that may be utilized in the above-described embodiments may be as follows.

Viscosity is the quantity that describes a fluid's resistance to flow.

For example viscosity of water at 25° C. is 8.94×10$^{-4}$ (Pa·S) and Air at 27° C. is 18.6 (μ Pa·S)

The viscosity of air depends mostly on the temperature. At 15° C., the viscosity of air is 1.81×10$^{-5}$ kg/(m·s), 18.1 μPa·s or 1.81×10$^{-5}$ Pa·s. The kinematic viscosity at 15° C. is 1.48×10$^{-5}$ m$^2$/s or 14.8 cSt. At 25° C., the viscosity is 18.6 μPa·s and the kinematic viscosity 15.7 cSt.

A widely used formula for the calculation of viscosity of gases is the Sutherland Equation given by $$\mu = \frac{bT^{3/2}}{T+S} \quad \text{(Formula 1)}$$

where b and S are constants and T is temperature expressed in Eq. 1. For air $$b = 1.458 \times 10^{-5} \frac{kg}{msK^{1/2}}$$

and S=110.4K.

Power Law is another approximation to calculate viscosity and is given by $$\frac{\mu}{\mu_0} = \left(\frac{T}{T_0}\right)^{0.7} \quad \text{(Formula 1.1)}$$

where $\mu_0$ is the value of viscosity at a reference temperature $T_0$, which could be 273K. empirically the viscosity of liquids is $$\ln\frac{\mu}{\mu_0} = a + b\left(\frac{T_0}{T}\right) + c\left(\frac{T_0}{T}\right)^2 \quad \text{(Formula 1.2)}$$

For water, $T_0$=273.16K, $\mu_0$=0.001792 kg/(m·s), a=−1.94, b=−4.80 and c=6.74.

As we can see from the above equations viscosity is directly proportional to temperature and the viscosity coefficient μ. However, and according to Newton's second law of motion the shear of a fluid is directly proportional to the force applied and inversely proportional to its viscosity.

$$F = m_d \frac{dv}{dt}$$

It should be appreciated that all of the embodiments described herein are merely exemplary and non-limiting. Other changes and variations to the embodiments that can be made by a person having ordinary skill in the art are envisioned as included with these embodiments.

What is claimed is:

1. An electric aircraft, comprising:
   a body;
   a first wing and a second wing, each of the first wing and the second wing having a plurality of flaps;
   a cockpit; and
   a dielectric elastomer power generator;
   a wind turbine;
   an electric jet turbine; and
   a rotational electromagnetic power generator,
   wherein the surface of the first wing and the second wing comprises at least a layer of solar cells; and
   the dielectric elastomer power generator, the wind turbine and the electric jet turbine are mounted on a top portion of a central body surface on the body and the rotational electromagnetic power generator is mounted on a bottom portion of the central plane surface on the body.

2. The electric aircraft of claim 1, further comprising at least one rear stabilizer disposed on a rear portion of the aircraft.

3. The electric aircraft of claim 1, further comprising, on a bottom portion of the central plane surface on the body, a first tank and a second tank, the first tank filled with helium gas and the second tank filled with atmospheric air.

4. The electric aircraft of claim 1, wherein the solar cells further comprise a plurality of microlenses and a heat resistant solar cell.

5. The electric aircraft of claim 4, wherein the microlenses are formed of at least one acrylic, biodegradable plant lignin and graphene oxide.

6. The electric aircraft of claim 1, wherein each of the plurality of flaps are controlled by a piston, the piston further comprising a first supporting base;
   a moving part connected to the first supporting base;
   a framing structure surrounding the moving part;
   a hinge configured to move the moving part up or down; and
   a second supporting base connected to the moving part on the end opposite from the first supporting base.

7. The electric aircraft of claim 6, wherein the hinge is further comprised of a plurality of W shaped hinges configured to expand and compress.

* * * * *